(12) United States Patent
Kawahara et al.

(10) Patent No.: US 10,405,442 B2
(45) Date of Patent: Sep. 3, 2019

(54) CABINET WITH LOCK AND INFORMATION PROCESSING EQUIPMENT

(71) Applicant: Konica Minolta, Inc., Chiyoda-ku, Tokyo (JP)

(72) Inventors: Morihisa Kawahara, Toyohashi (JP); Hayato Mori, Okazaki (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 3 days.

(21) Appl. No.: 15/919,276

(22) Filed: Mar. 13, 2018

(65) Prior Publication Data

US 2018/0270969 A1    Sep. 20, 2018

(30) Foreign Application Priority Data

Mar. 17, 2017 (JP) .................. 2017-052413

(51) Int. Cl.
| | |
|---|---|
| H05K 5/02 | (2006.01) |
| B60B 33/00 | (2006.01) |
| E05B 47/00 | (2006.01) |
| E05B 65/00 | (2006.01) |
| H05K 7/14 | (2006.01) |
| E05B 53/00 | (2006.01) |
| E05B 47/02 | (2006.01) |
| E05B 73/00 | (2006.01) |
| G03G 21/16 | (2006.01) |

(52) U.S. Cl.
CPC ....... *H05K 5/0221* (2013.01); *B60B 33/0092* (2013.01); *E05B 47/0001* (2013.01); *E05B 47/023* (2013.01); *E05B 53/00* (2013.01); *E05B 65/00* (2013.01); *E05B 73/0082* (2013.01); *G03G 21/1604* (2013.01); *H05K 7/1488* (2013.01); *E05B 47/0012* (2013.01); *E05B 2047/002* (2013.01); *E05B 2047/0084* (2013.01)

(58) Field of Classification Search
CPC ................. H05K 5/0221; H05K 7/1488
See application file for complete search history.

(56) References Cited

U.S. PATENT DOCUMENTS

2015/0062796 A1* 3/2015 Yu ..................... G06F 1/181
                                                        361/679.31

FOREIGN PATENT DOCUMENTS

| JP | 2000-211525 A |   | 8/2000 |
|---|---|---|---|
| JP | 2000211525 A | * | 8/2000 |
| JP | 2007-14699 A |   | 1/2007 |

* cited by examiner

*Primary Examiner* — Erika J Villaluna

(74) *Attorney, Agent, or Firm* — Buchanan Ingersoll & Rooney PC

(57) ABSTRACT

A cabinet with a lock includes a cabinet in which a server is accommodated, a first locking mechanism which does not allow the server to be taken out of the cabinet with a locking manipulation, and a second locking mechanism which locks a position of the cabinet or a position of the server in coordination with a locking operation by the first locking mechanism.

13 Claims, 8 Drawing Sheets

CABINET WITH LOCK AND INFORMATION PROCESSING EQUIPMENT

The entire disclosure of Japanese Patent Application No. 2017-052413 filed on Mar. 17, 2017 is incorporated herein by reference in its entirety.

BACKGROUND

Technological Field

The present invention relates to a cabinet with a lock and information processing equipment including the same.

Description of the Related Art

For example, Japanese Laid-Open Patent Publications Nos. 2007-14699 and 2000-211525 disclose a cabinet in which an object is accommodated.

The cabinet disclosed in Japanese Laid-Open Patent Publication No. 2007-14699 is constructed to be movable and includes a door portion provided to be openable. The door is provided with a latch for locking a closed state of the door.

The cabinet disclosed in Japanese Laid-Open Patent Publication No. 2000-211525 includes an accommodation portion which stores a wagon with casters so as to be able to take in and out the same. Cover means provided in the accommodation portion for covering a part of a door portion of the wagon with casters in an openable manner switches between a free state in which the wagon with casters accommodated in the accommodation portion can be taken in and out and a locked state in which the wagon cannot be taken in and out. Locking means for holding the cover means to the locked state is further provided.

SUMMARY

Installation of a server at an arbitrary location has recently been demanded. When a cabinet which accommodates the server is arranged without taking any measures, however, the server is taken out of the cabinet and stolen.

Simply by applying the construction disclosed in Japanese Laid-Open Patent Publications Nos. 2007-14699 and 2000-211525 to a cabinet which accommodates a server and providing only a locking mechanism which maintains a door covering in an openable manner an opening portion for taking out the server to a closed state, however, theft of the server by breaking the door to open is a concern. Even though the door is not broken to open, theft of the cabinet as a whole is a concern.

With such a construction with a locking mechanism for locking a door provided in a cabinet, storage of a server cannot be safe.

The present invention was made in view of the problems as above, and an object of the present invention is to provide a cabinet with a lock and information processing equipment which prevent theft of a server accommodated in a cabinet.

To achieve at least one of the abovementioned objects, according to an aspect of the present invention, a cabinet with a lock reflecting one aspect of the present invention comprises a cabinet in which a server is accommodated, a first locking mechanism which does not allow the server to be taken out of the cabinet with a locking manipulation, and a second locking mechanism which locks a position of the cabinet or a position of the server in coordination with a locking operation by the first locking mechanism.

To achieve at least one of the abovementioned objects, according to an aspect of the present invention, information processing equipment reflecting one aspect of the present invention comprises the above-described cabinet with a lock and an image forming apparatus.

BRIEF DESCRIPTION OF THE DRAWINGS

The advantages and features provided by one or more embodiments of the invention will become more fully understood from the detailed description given hereinbelow and the appended drawings which are given by way of illustration only, and thus are not intended as a definition of the limits of the present invention.

DETAILED DESCRIPTION OF EMBODIMENTS

Figure 1:
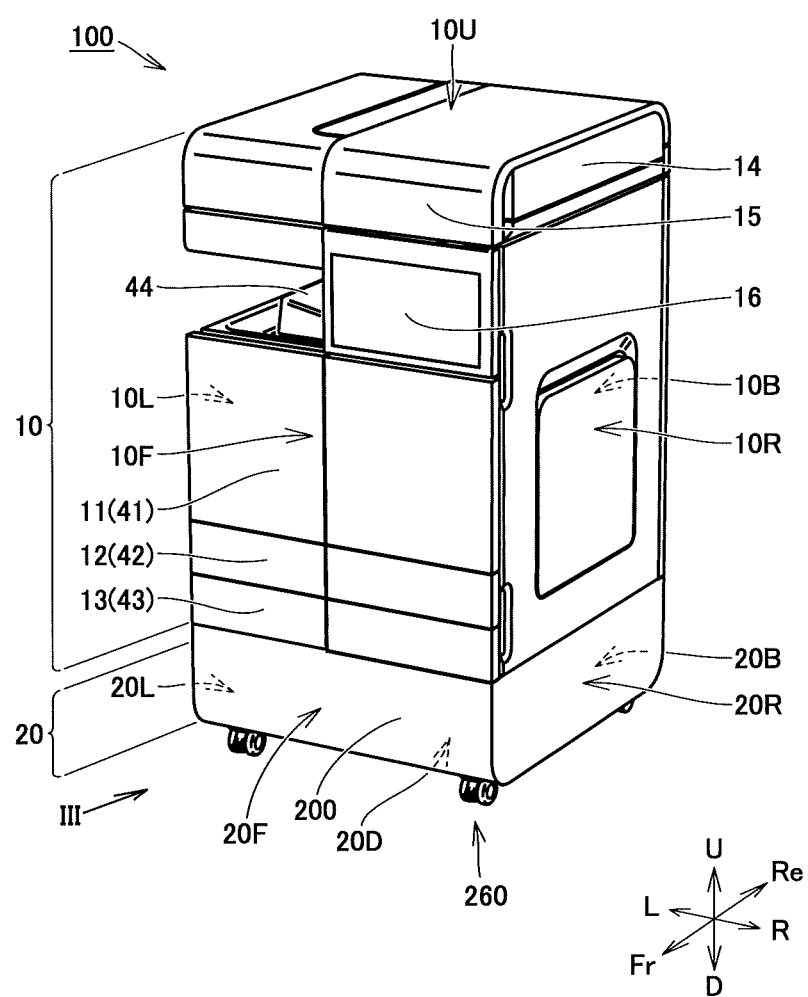
FIG. 1 is a perspective view showing information processing equipment according to a first embodiment.

Hereinafter, one or more embodiments of the present invention will be described with reference to the drawings. However, the scope of the invention is not limited to the disclosed embodiments.

The same or common elements in the embodiment shown below have the same reference characters allotted and description thereof will not be repeated.

Arrows U and D in the drawings indicate a vertical direction, arrows Fr and Re indicate a front-rear direction, and arrows L and R indicate a lateral direction when viewed from the front.

First Embodiment (Information Processing Equipment)

Figure 2:
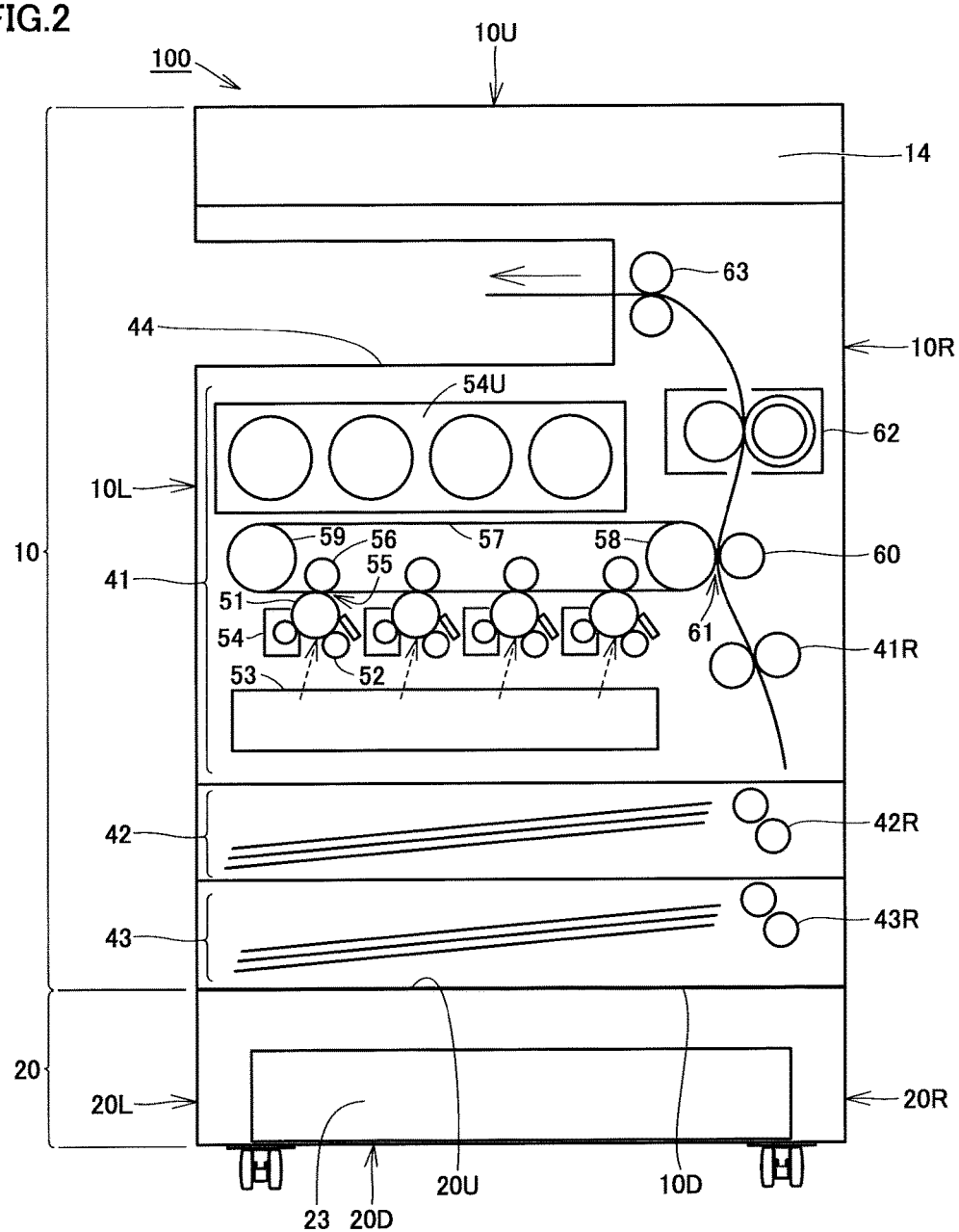
FIG. 2 is a schematic diagram showing an internal construction of the information processing equipment according to the first embodiment.

FIG. 1 is a perspective view showing information processing equipment according to a first embodiment. FIG. 2 is a schematic diagram showing an internal construction of the information processing equipment according to the first embodiment Information processing equipment 100 according to the first embodiment will be described with reference to FIGS. 1 and 2.

As shown in FIGS. 1 and 2, information processing equipment 100 includes an image forming apparatus 10 and a server apparatus 20.

(Image Forming Apparatus)

An outer geometry of image forming apparatus 10 is substantially in a form of a parallelepiped as a whole, and image forming apparatus 10 has a front wall portion 10F, a back wall portion 10B, a right sidewall portion 10R, a left sidewall portion 10L, an upper wall portion 10U, and a bottom wall portion 10D (FIG. 2). Bottom wall portion 10D is opposed to server apparatus 20.

Image forming apparatus 10 (FIG. 2) includes as its constituent elements, an image forming portion 41 which forms an image on a recording medium (typically recording paper) and paper carrying portions 42 and 43, all of which are arranged inside image forming apparatus 10. Image forming portion 41 includes a photoconductor 51, a charging apparatus 52, an exposure apparatus 53, a development apparatus 54, a toner unit 54U, a primary transfer portion 55, a primary transfer roller 56, an intermediate transfer belt 57, support rollers 58 and 59, a secondary transfer roller 60, a secondary transfer portion 61, a fixing portion 62, and a paper ejection roller 63.

Four sets of photoconductor 51 and primary transfer portion 55 are provided in correspondence with yellow, magenta, cyan, and black colors, and image forming apparatus 10 forms toner images corresponding to respective colors on a surface of intermediate transfer belt 57 by using such equipment. Toner images of respective colors are layered on one another on the surface of intermediate transfer belt 57 and thereafter intermediate transfer belt 57 transports the color toner image to secondary transfer portion 61 between intermediate transfer belt 57 and secondary transfer roller 60.

Paper carrying portions 42 and 43 are provided in a lower portion of image forming apparatus 10 and accommodates a plurality of sheets of recording paper.

Pick-up rollers 42R and 43R and a timing roller 41R form a part of a paper transportation path and recording paper is transported to secondary transfer portion 61 through pick-up rollers 42R and 43R and timing roller 41R. The color toner image carried on intermediate transfer belt 57 is transferred to a surface of recording paper in secondary transfer portion 61. The color toner image is fixed onto the surface of recording paper by fixing portion 62. The recording paper is thereafter ejected to a paper ejection portion 44 by paper ejection roller 63.

An operation panel 16, a cover 11 which covers image forming portion 41, a cover 12 which covers paper carrying portion 42, and a cover 13 which covers paper carrying portion 43 are provided on a side of front wall portion 10F of image forming apparatus 10. Cover 11 is opened in maintenance and inspection of image forming portion 41 (FIG. 2) or replacement of toner unit 54U (FIG. 2). When paper is added, cover 12 is pulled forward together with paper carrying portion 42 (which is also called a paper feed cassette) or cover 13 is pulled forward together with paper carrying portion 43.

A seamier unit 14 is provided in an upper portion of image forming apparatus 10 and partially covered with a cover 15 in an openable manner.

(Server Apparatus 20)

Server apparatus 20 is connected to image forming apparatus 10 through a not-shown signal line and exchanges as necessary a sensor value from each apparatus or data used for operation of the apparatus. Image forming apparatus 10 and server apparatus 20 have power supplies separate from each other and can operate independently of each other, and server apparatus 20 is basically characterized by constantly operating in order to be accessed by client apparatuses through a network.

Server apparatus 20 alone can function as a mail server, a web server, an application server, a file server, or a print server, and can perform processing in response to a request from a client apparatus based on a predetermined computer program (for example, storage of data, organization of data, various types of dynamic processing, and various types of response processing).

An outer geometry of server apparatus 20 is also substantially in a form of a parallelepiped as a whole (FIG. 1), and server apparatus 20 has a front wall portion 20F, a back wall portion 20B, a right sidewall portion 20R, a left sidewall portion 20L, an upper wall portion 20U, and a bottom wall portion 20D. Upper wall portion 20U is opposed to bottom wall portion 10D of image forming apparatus 10.

Figure 3:
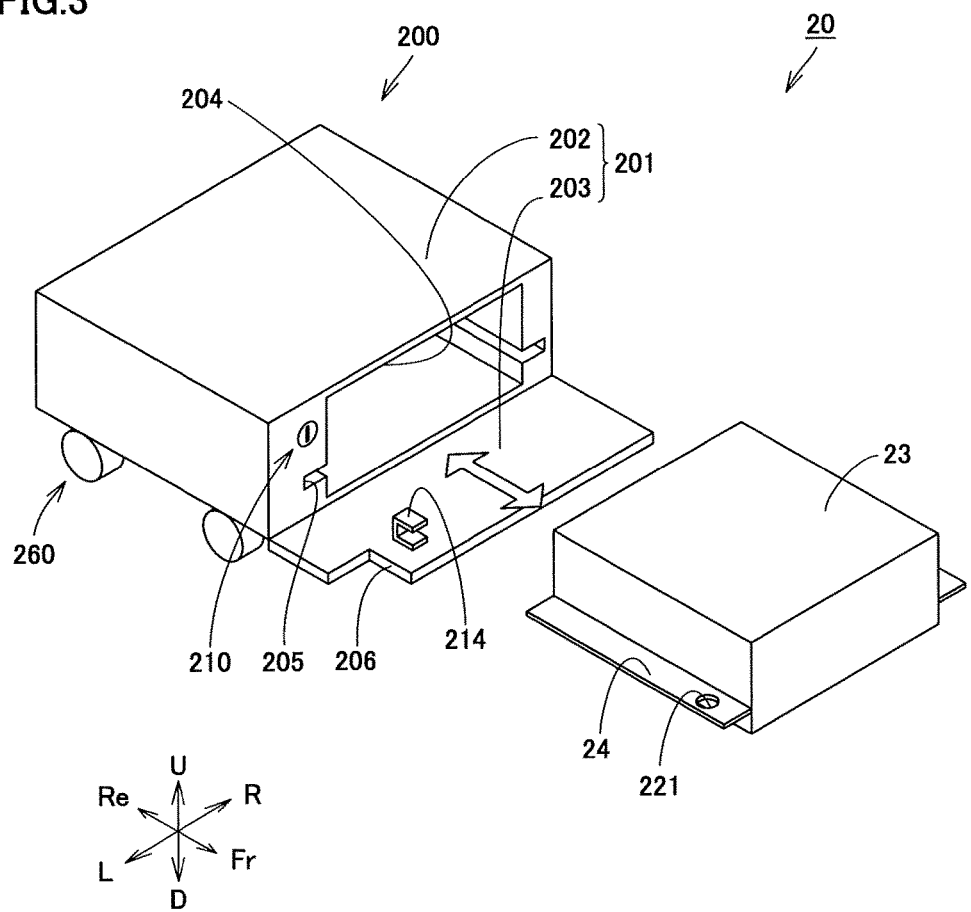
FIG. 3 is an exploded perspective view of a server apparatus according to the first embodiment.

FIG. 3 is an exploded perspective view of the server apparatus according to the first embodiment. Details of the server apparatus will be described with reference to FIG. 3.

As shown in FIG. 3, server apparatus 20 includes a server 23 and a cabinet with a lock 200. Server 23 includes a motherboard, a CPU, a recording device (an HDD or an SSD), a network interface (IF), and a box which accommodates these components.

A pair of movable rails 24 is provided on respective side surface portions of server 23 which are opposed to each other. The pair of movable rails 24 is provided, for example, on respective opposing side surfaces of server 23 in the lateral direction. The pair of movable rails 24 is, for example, in a shape of a plate. The pair of movable rails 24 extends, for example, along the front-rear direction.

The pair of movable rails 24 is constructed to be slidable with respect to fixed rails 205 provided in cabinet with a lock 200 which will be described later. An insertion hole 221 is provided in each of the pair of movable rails 24. Insertion hole 221 functions as a locked portion which is locked to a locking rod portion 222 as a locking portion which will be described later.

Cabinet with a lock 200 includes a cabinet 201 including a main body portion 202 and a door portion 203, a plurality of locking mechanisms 210, 220, 230, and 240 (see FIG. 4) which will be described later, and a plurality of casters 260.

Cabinet 201 is constructed to be able to accommodate server 23. Main body portion 202 includes an accommodation space for accommodation of server 23. Main body portion 202 includes an opening portion 204 for taking in and out server 23. A manipulation portion for manipulating locking mechanism 210 which will be described later is provided around opening portion 204.

A pair of fixed rails 205 is provided on an inner peripheral surface of main body portion 202. The pair of fixed rails 205 is implemented, for example, by groove portions provided in the inner peripheral surface of main body portion 202. The pair of fixed rails 205 is provided, for example, in the inner peripheral surface of main body portion 202 in the lateral direction. The pair of fixed rails 205 is provided, for example, to extend in the front-rear direction.

Door portion 203 closes opening portion 204 in an openable manner. Door portion 203 has a pivot axis on a side of a lower end and constructed to be pivotable such that an upper end thereof moves away from main body portion 202. Door portion 203 is constructed to be pivotable around die pivot axis which extends in the lateral direction.

A cut portion 206 is provided in a corner portion of door portion 203. Cut portion 206 exposes the manipulation portion for manipulating locking mechanism 210 to the outside. A pivot restriction portion 214 is provided on an inner surface of door portion 203.

The plurality of casters 260 are attached to a bottom portion of cabinet 201. Each of the plurality of casters 260 includes a roller 261 (see FIG. 4) and a roller support portion 262 (see FIG. 4) which rotatably supports roller 261. Roller support portion 262 is fixed to the bottom portion of cabinet

201. Roller 261 includes a plurality of recesses 231 (see FIG. 4) in a circumferential surface. Recess 231 functions as an engaged portion engaged with an engagement rod portion 232 as an engagement portion which will be described later.

(Locking Mechanism)

Figure 4:
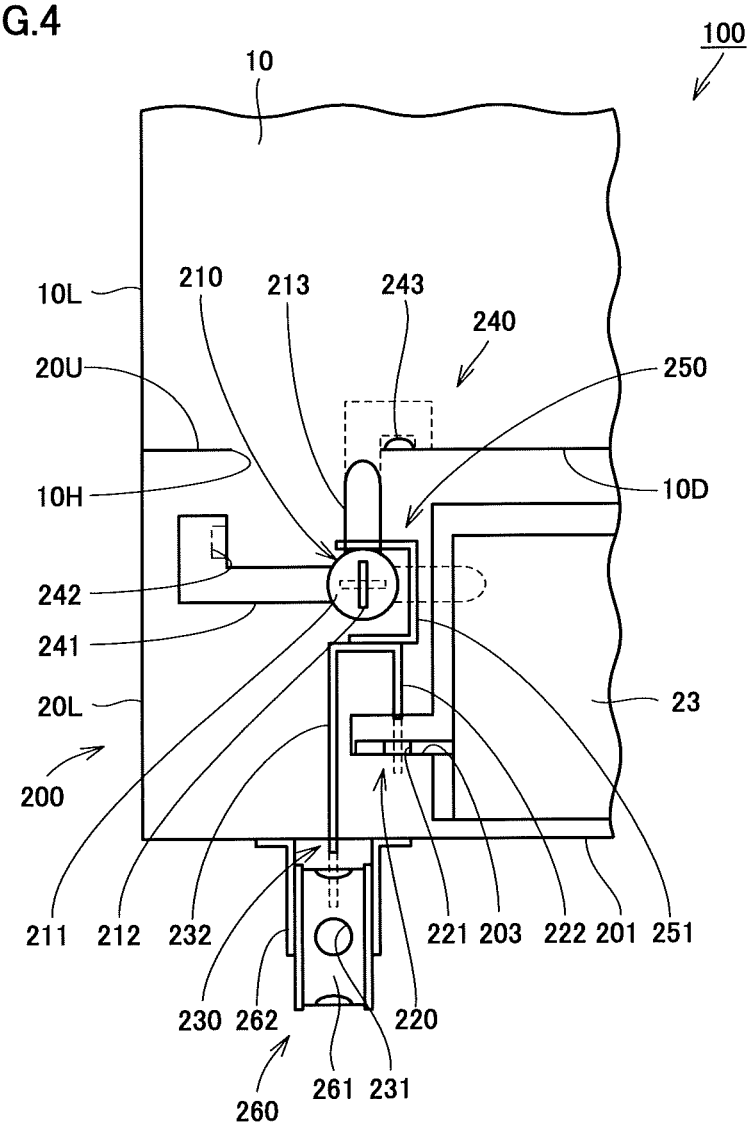
FIG. 4 is a schematic front view for illustrating a plurality of locking mechanisms provided in a cabinet with a lock according to the first embodiment.
Figure 5:
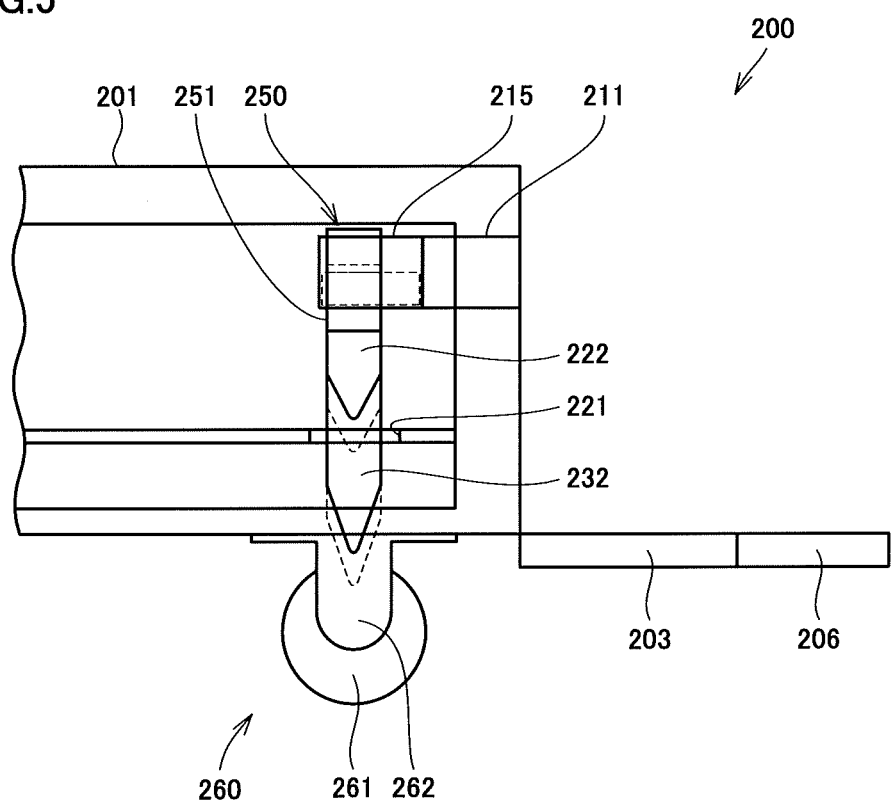
FIG. 5 is a schematic side view for illustrating the plurality of locking mechanisms provided in the cabinet with a lock according to the first embodiment.
Figure 6:
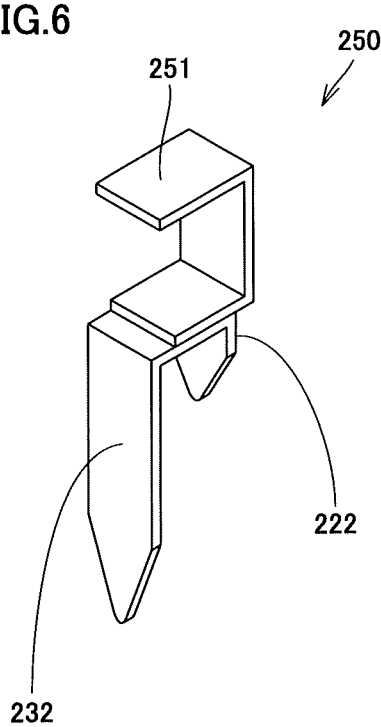
FIG. 6 is a perspective view of a moving element which moves in coordination with a locking manipulation for the locking mechanism according to the first embodiment.

FIG. 4 is a schematic front view for illustrating a plurality of locking mechanisms provided in the cabinet with a lock according to the first embodiment. FIG. 5 is a schematic side view for illustrating the plurality of locking mechanisms provided in the cabinet with a lock according to the first embodiment. FIG. 6 is a perspective view of a moving element which moves in coordination with a locking operation by the locking mechanism according to the first embodiment. FIGS. 4 and 5 show a position of the locking mechanism before movement with a solid line and a position after movement with a dashed line. The plurality of locking mechanisms 210, 220, 230, and 240 will be described with reference to FIGS. 4 to 6.

Locking mechanism 210 does not allow server 23 to be taken out of cabinet 201 as a result of a locking manipulation. Locking mechanism 210 locks door portion 203. Specifically, locking mechanism 210 switches between a locked state in which a closed state of opening portion 204 being closed by door portion 203 is maintained and an unlocked state in which door portion 203 can pivot to open and close opening portion 204.

Locking mechanism 210 is constituted of a rotating element 211, a locking piece 213, and pivot restriction portion 214.

Rotating element 211 includes a key groove 212. Rotating element 211 is, for example, columnar. Rotating element 211 is rotatably attached to main body portion 202. Rotating element 211 is provided, for example, as being rotatable around a rotation axis, with a direction in parallel to the front-rear direction being defined as the rotation axis.

Locking piece 213 extends along a radial direction of rotating element 211. Locking piece 213 is fixed to a circumferential surface of rotating element 211. Locking piece 213 rotates in a direction the same as the direction of rotation of rotating element 211, with rotation of rotating element 211.

Pivot restriction portion 214 restricts pivot of door portion 203 in cooperation with locking piece 213. Pivot restriction portion 214 includes, for example, two pivot restriction elements which are aligned in the front-rear direction. As locking piece 213 is interposed between the two pivot restriction elements, pivot restriction portion 214 restricts pivot of door portion 203.

A varying portion 215 of which height position is variable with rotation of rotating element 211 is provided at a rear end of rotating element 211. Varying portion 215 is, for example, semicolumnar. Varying portion 215 is located at a position as high as an upper end of rotating element 211 in the unlocked state. Varying portion 215 has an upper end located at a position as high as a central axis of rotating element 211 in the locked state.

Varying portion 215 varies a height position of a moving element 250 as its height position is variable with rotation of rotating element 211.

Moving element 250 is supported by varying portion 215 by abutting to a position of the upper end of varying portion 215. Moving element 250 includes a coupling portion 251, a locking rod portion 222, and an engagement rod portion 232. Coupling portion 251 is coupled to varying portion 215.

Locking rod portion 222 is connected to coupling portion 251. Locking rod portion 222 extends along the vertical direction. Locking rod portion 222 moves in the vertical direction with variation in height position of moving element 250. Locking rod portion 222 is constructed to be inserted in insertion hole 221 provided in one of the pair of movable rails 24 of server 23.

Engagement rod portion 232 is connected to coupling portion 251. Engagement rod portion 232 extends along the vertical direction. Engagement rod portion 232 moves in the vertical direction with variation in height position of moving element 250. Engagement rod portion 232 is constructed to be inserted in recess 231 provided in roller 261.

Locking mechanism 220 is constituted of locking rod portion 222 and insertion hole 221 provided in movable rail 24. As will be described later, locking mechanism 220 locks a position of server 23 in coordination with a locking operation by locking mechanism 210.

Locking mechanism 220 locks server 23 to cabinet 201. Specifically, locking mechanism 220 switches between a locked state in which server 23 is immobilized with respect to cabinet 201 and an unlocked state in which server 23 is movable with respect to cabinet 201.

Locking mechanism 230 is constituted of engagement rod portion 232 and recess 231 provided in roller 261. As will be described later, locking mechanism 230 locks a position of cabinet 201 in coordination with a locking operation by locking mechanism 210.

Locking mechanism 230 locks caster 260. Specifically, locking mechanism 230 switches between a locked state in which roller 261 of caster 260 is not allowed to rotate and an unlocked state in which roller 261 is allowed to rotate.

Locking mechanism 240 locks cabinet 201 to an object arranged adjacently to cabinet 201. Locking mechanism 240 locks cabinet 201 to image forming apparatus 10 as an object arranged on cabinet 201.

Locking mechanism 240 is constituted of rotating element 211, a locking piece 241, and a movement restriction portion 243.

Locking piece 241 extends along the radial direction of rotating element 211. Locking piece 241 is fixed to the circumferential surface of rotating element 211. Locking piece 241 rotates in a direction the same as the direction of rotation of rotating element 211 with rotation of rotating element 211. Locking piece 241 is constructed to enter a housing of image forming apparatus 10 through an opening 10H provided such that bottom wall portion 10D of image forming apparatus 10 and an upper wall portion of cabinet 201 can pass through. Locking piece 241 includes a fitting portion 242.

Movement restriction portion 243 restricts movement of cabinet 201 with respect to image forming apparatus 10 in cooperation with locking piece 241. Movement restriction portion 243 is constructed to be fitted to fitting portion 242 of locking piece 241. As movement restriction portion 243 is fitted to fitting portion 242, movement of locking piece 241 in the lateral direction and the front-rear direction is restricted. Consequently, cabinet 201 is locked to image forming apparatus 10. Image forming apparatus 10 includes the image forming portion including many mechanisms for forming an image on paper as above and is large in weight and size. Since cabinet 201 is thus locked to image forming apparatus 10, movement, that is, theft, of the cabinet and the server installed therein becomes further difficult.

(Operation of Locking Mechanism)

In locking door portion 203, a user performs a locking manipulation onto locking mechanism 210. Specifically, the user inserts a lock key into key groove 212 and turns rotating element 211 clockwise. As rotating element 211 rotates clockwise, locking piece 213 rotates clockwise as shown with the dashed line in FIG. 4.

Locking piece 213 thus enters a space between two pivot restriction elements of pivot restriction portion 214 described above. Consequently, pivot of door portion 203 is restricted and door portion 203 is locked.

As rotating element 211 rotates as a result of the locking manipulation described above, varying portion 215 rotates while it slides against an inner surface of moving element 250. Thus, as shown with the dashed line in FIG. 5, a position of the upper end of varying portion 215 is lowered. Moving element 250 is supported by varying portion 215 by abutting to the position of the upper end of varying portion 215. Therefore, as the position of the upper end of varying portion 215 is lowered, moving element 250 moves downward.

As moving element 250 moves downward, locking rod portion 222 of locking mechanism 220 is inserted in insertion hole 221 provided in one of the pair of movable rails 24 of server 23. Locking rod portion 222 is connected to cabinet 201 by coupling portion 251, varying portion 215, and rotating element 211. Therefore, as locking rod portion 222 is inserted in insertion hole 221, server 23 is locked to cabinet 201.

Thus, locking mechanism 220 is operated in coordination with a locking operation by locking mechanism 210 to lock a position of server 23.

As moving element 250 moves downward, engagement rod portion 232 of locking mechanism 230 is inserted in recess 231 provided in roller 261 of caster 260. Roller 261 is thus not allowed to rotate.

Locking mechanism 230 is thus manipulated in coordination with the locking operation by locking mechanism 210 to lock a position of cabinet 201.

As rotating element 211 rotates clockwise, locking piece 241 of locking mechanism 240 rotates clockwise as shown with the dashed line in FIG. 4. Thus, locking piece 241 enters image forming apparatus 10 through opening 10H and movement restriction portion 243 is fitted to fitting portion 242.

As movement restriction portion 243 is fitted to fitting portion 242, movement of locking piece 241 in the lateral direction and the front-rear direction is restricted and consequently cabinet 201 is locked to image forming apparatus 10.

Locking mechanism 240 is thus manipulated in coordination with the locking operation by locking mechanism 210 to lock a position of cabinet 201.

As above, with cabinet with a lock 200 according to the first embodiment, locking mechanism 210 locks door portion 203 so that it becomes difficult to take server 23 out of cabinet 201.

As locking mechanism 220 is manipulated in coordination with the locking operation by locking mechanism 210 to lock server 23 to cabinet 201, it becomes difficult to move server 23 away from cabinet 201 even though cabinet 201 is broken. Theft of server 23 thus becomes difficult.

Locking mechanism 230 is manipulated in coordination with the locking operation by locking mechanism 210 so as not to allow pivot of roller 261 so that it becomes difficult to steal cabinet 201 as a whole while it accommodates server 23.

Locking mechanism 240 is manipulated in coordination with the locking operation by locking mechanism 210 to lock cabinet 201 to image forming apparatus 10, so that it becomes difficult to steal cabinet 201 as a whole while it accommodates server 23.

As above, with cabinet with a lock 200 according to the first embodiment, theft of the server accommodated in the cabinet can be prevented.

Additionally, as locking mechanisms 220, 230, and 240 are manipulated in coordination with the locking operation by locking mechanism 210 as above, a user does not have to perform a locking manipulation for each locking mechanism and convenience can be improved.

Though an example in which locking mechanisms 220, 230, and 240 in addition to locking mechanism 210 are provided is illustrated and described in the first embodiment, limitation thereto is not intended. Locking mechanism 210 and at least any of locking mechanisms 220, 230, and 240 should only be provided.

By providing locking mechanism 210 and at least any of locking mechanisms 220, 230, and 240, not only an effect of locking by locking mechanism 210 but also an effect of locking by any of locking mechanisms 220, 230, and 240 are exhibited. Theft of the server accommodated in the cabinet can thus be prevented.

Though an example in which a plurality of casters 260 are provided is illustrated and described in the first embodiment, limitation thereto is not intended and a plurality of casters 260 do not have to be provided.

First Modification

Figure 7:
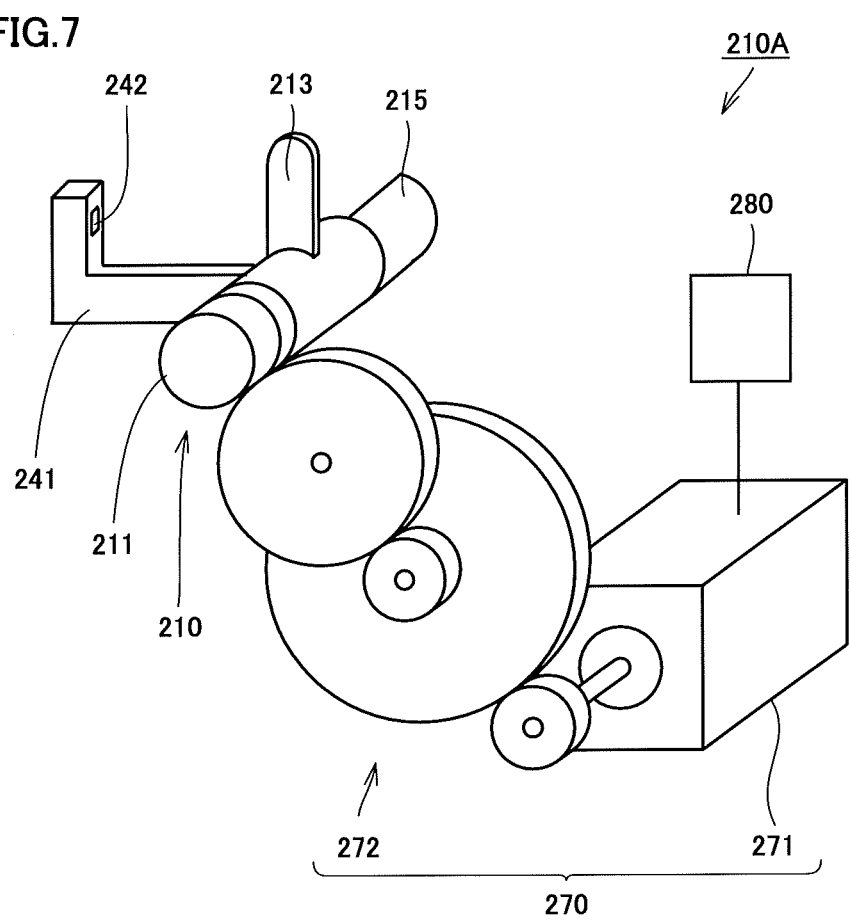
FIG. 7 is a schematic perspective view showing a locking mechanism according to a first modification.

FIG. 7 is a schematic perspective view showing a locking mechanism according to a first modification. Locking mechanism 210 according to the first modification will be described with reference to FIG. 7.

As shown in FIG. 7, a locking mechanism 210A according to the first modification is different from locking mechanism 210 according to the first embodiment in including a rotational drive portion 270 which automatically rotates rotating element 211, and it is otherwise substantially similar in construction.

Rotational drive portion 270 includes a drive source 271 and a driving force transmission mechanism 272. Drive source 271 is implemented, for example, by a motor. Driving force transmission mechanism 272 is implemented by a plurality of gears and it transmits driving force generated by drive source 271 to rotating element 211. Drive source 271 is connected to a controller 280.

Controller 280 controls an operation of drive source 271. Controller 280 may be provided in server apparatus 20 or in image forming apparatus 10.

In this case, locking mechanism 210 functions as an electrical lock. For example, a control signal may be input to controller 280 by providing a reader in door portion 203 and holding an ID card over the reader.

Alternatively, a control signal may be input to controller 280 by providing an identification number entry portion in door portion 203 and entering an identification number. Further alternatively, a control signal may be input to controller 280 by performing fingerprint authentication or using a remote controller. Still further alternatively, a control signal may be input from operation panel 16 provided on a side of image forming apparatus 10.

Controller 280 controls drive source 271 based on the control signal. The locking manipulation by locking mechanism 210 is thus performed. Locking mechanism 210A may be configured as above.

Second Embodiment

Figure 8:
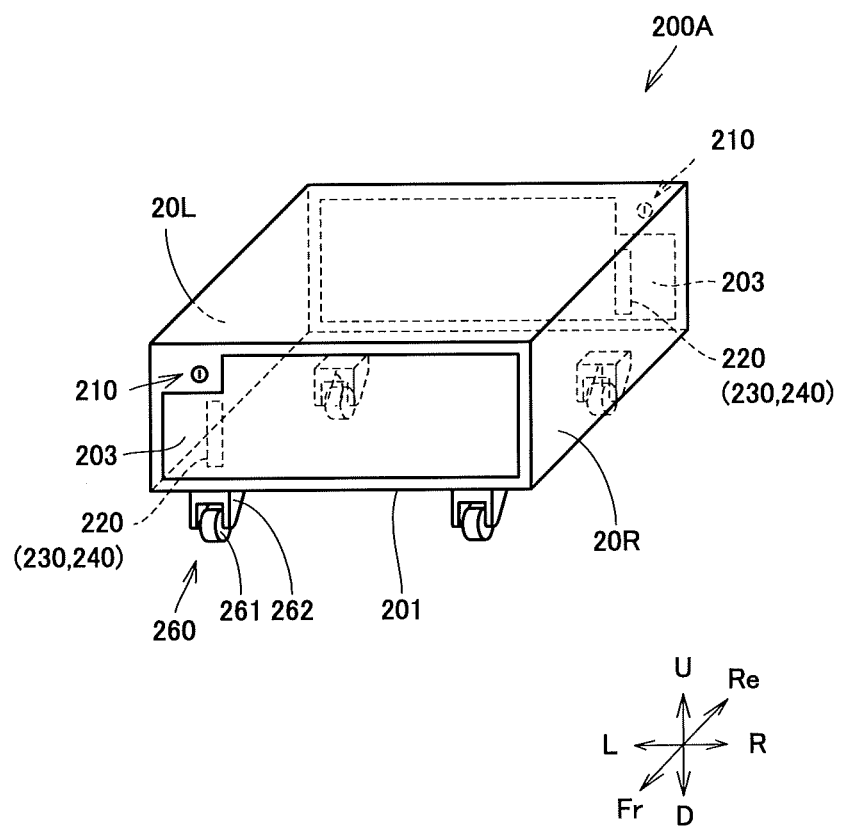
FIG. 8 is a perspective view showing a cabinet with a lock according to a second embodiment.

FIG. 8 is a perspective view showing a cabinet with a lock according to a second embodiment. A cabinet with a lock 200A according to the second embodiment will be described with reference to FIG. 8.

As shown in FIG. 8, cabinet with a lock 200A according to the second embodiment is different from cabinet with a lock 200 according to die first embodiment in that a plurality of door portions 203 and a plurality of locking mechanisms 210, 220, 230, and 240 are provided, and it is otherwise substantially similar in construction.

Two door portions 203 are provided. Two door portions 203 are provided in respective side surfaces of cabinet 201 which are opposed to each other. Specifically, two door portions 203 are provided on a front surface side and a rear surface side of cabinet 201, respectively.

Two locking mechanisms 201 are provided. One of two locking mechanisms 210 locks door portion 203 provided on the front surface side. The other of two locking mechanisms 210 locks door portion 203 provided on the rear surface side.

One locking mechanism 210 and the other locking mechanism 210 are arranged as being aligned in an oblique direction. One locking mechanism 210 and the other locking mechanism 210 are arranged diagonally.

Cabinet 201 includes a right sidewall portion 20R and a left sidewall portion 20L as sidewall portions which are connected to opposing ends of one door portion 203 and extend in a direction opposite to a direction in which one door portion 203 opens.

Right sidewall portion 20R and left sidewall portion 20L have one ends located on the side of door portion 203 and the other ends opposite to the one ends.

A plurality of casters 260 include caster 260 located on a side of one door portion 203 and caster 260 located on a side of the other ends of right sidewall portion 20R and left sidewall portion 20L.

Two locking mechanisms 220, two locking mechanisms 230, and two locking mechanisms 240 are provided. Locking mechanisms 220, 230, and 240 are provided for each of one locking mechanism 210 and the other locking mechanism 220. Locking mechanisms 220, 230, and 240 are substantially similar in construction to those in the first embodiment and a locking manipulation is performed in coordination with a locking operation by locking mechanism 210.

One of two locking mechanisms 230 locks caster 260 (a first caster) located on one end side of right sidewall portion 20R and left sidewall portion 20 and the other of two locking mechanisms 230 locks caster 260 (a second caster) located on the other end side of right sidewall portion 20R and left sidewall portion 20L.

One of two locking mechanisms 220 locks server 23 in a portion located on one end side of right sidewall portion 20R and left sidewall portion 20L to cabinet 201 and the other of two locking mechanisms 220 locks server 23 in a portion located on the other end side of right sidewall portion 20R and left sidewall portion 20L to cabinet 201.

One of two locking mechanisms 240 locks cabinet 201 to image forming apparatus 10 in the portion located on one end side of right sidewall portion 20R and left sidewall portion 20L and the other of two locking mechanisms 240 locks cabinet 201 to image forming apparatus 10 in the portion located on the other end side of right sidewall portion 20R and left sidewall portion 20L.

According to the construction as above as well, cabinet with a lock 200A according to the second embodiment obtains an effect substantially the same as the effect of cabinet with a lock 200 according to the first embodiment.

Though an example in which two locking mechanisms 220, two locking mechanisms 230, and two locking mechanisms 240 are provided is illustrated and described in the second embodiment, limitation thereto is not intended and a plurality of at least any of locking mechanisms 220, 230, and 240 may be provided.

Though an example in which two door portions 203 and two locking mechanisms 210 are provided is illustrated and described in the second embodiment, limitation thereto is not intended and a single door portion 203 may be provided and a single locking mechanism 210 may be provided. In this case, a locking manipulation for locking mechanism 220, 230, or 240 located farther from locking mechanism 210 of two locking mechanisms 220, two locking mechanisms 230, or two locking mechanisms 240 is performed by a rotational motive power transmission mechanism which transmits rotational motive power of rotating element 211.

The cabinet with a lock in the present disclosure described above includes a cabinet in which a server is accommodated, a first locking mechanism which does not allow the server to be taken out of the cabinet with a locking manipulation, and a second locking mechanism which locks a position of the cabinet or a position of the server in coordination with a locking operation by the first locking mechanism.

In the cabinet with a lock in the present disclosure, the cabinet preferably includes a door portion which is opened and closed for taking in and out the server and the first locking mechanism preferably locks the door portion. In this case, the second locking mechanism may lock the server to the cabinet.

In the cabinet with a lock in the present disclosure, the second locking mechanism may include a locked portion provided in the server and a locking portion which is connected to the cabinet and does not allow the server to be moved by being locked to the locked portion. In this case, the locking portion is preferably locked to the locked portion in coordination with the locking operation by the first locking mechanism.

The cabinet with a lock in the present disclosure may further include a plurality of casters which movably support the cabinet. The cabinet preferably includes a door portion which is opened and closed for taking in and out the server and the first locking mechanism preferably locks the door portion. In this case, the second locking mechanism may lock at least any of the plurality of casters.

In the cabinet with a lock in the present disclosure, the second locking mechanism may include an engaged portion provided in the caster and an engagement portion which does not allow the caster to rotate by being engaged with the engaged portion. In this case, the engagement portion is preferably engaged with the engaged portion in coordination with the locking operation by the first locking mechanism.

In the cabinet with a lock in the present disclosure, the cabinet is preferably provided with a lock manipulation portion for activating the first locking mechanism.

In the cabinet with a lock in the present disclosure, a plurality of first locking mechanisms may be provided.

In the cabinet with a lock in the present disclosure, the cabinet may include a first door portion and a second door portion which are opened and closed for taking in and out the server. In this case, the first door portion and the second door portion are preferably provided in different side surfaces of the cabinet. A plurality of first locking mechanisms may include two first locking mechanisms. In this case, one of the two first locking mechanisms preferably locks the first door portion and the other of the two first locking mechanisms preferably locks the second door portion.

In the cabinet with a lock in the present disclosure, a plurality of second locking mechanisms may be provided.

In the cabinet with a lock in the present disclosure, the cabinet preferably includes a door portion which is opened and closed for taking in and out the server and sidewall portions which are connected to respective opposing ends of the door portion and extend in a direction opposite to a direction in which the door portion opens. The sidewall portions have one ends located on a side of the door portion and the other ends opposite to the one ends.

The plurality of casters preferably include a first caster located on the side of the door portion and a second caster located on a side of the other ends of the sidewall portions. In this case, the second locking mechanism may include two second locking mechanisms. One of the two second locking mechanisms preferably locks the first caster and the other of the two second locking mechanisms preferably locks the second caster.

In the cabinet with a lock in the present disclosure, the cabinet preferably further includes a door portion which is opened and closed for taking in and out the server, and the first locking mechanism preferably locks the door portion. In this case, the second locking mechanism may lock the cabinet to an object arranged adjacently to the cabinet.

The information processing equipment in the present disclosure described above includes the cabinet with a lock and an image forming apparatus.

In the information processing equipment in the present disclosure, the image forming apparatus is preferably arranged on the cabinet with a lock, and the second locking mechanism preferably locks the cabinet to the image forming apparatus.

Although embodiments of the present invention have been described and illustrated in detail, the disclosed embodiments are made for purposes of illustration and example only and not limitation. The scope of the present invention should be interpreted by terms of the appended claims.

What is claimed is:

1. A cabinet with a lock comprising:
   a cabinet in which a server is accommodated;
   the cabinet comprising a door portion which is opened and closed for taking in and out the server;
   a first locking mechanism which does not allow the server to be taken out of the cabinet with a locking manipulation by locking the door portion; and
   a second locking mechanism which locks a position of the cabinet or a position of the server in coordination with a locking operation by the first locking mechanism, the second locking mechanism locking the server to the cabinet or locking at least any of a plurality of casters.

2. The cabinet with a lock according to claim 1, wherein the second locking mechanism locks the server to the cabinet.

3. The cabinet with a lock according to claim 2, wherein the second locking mechanism includes a locked portion provided in the server and a locking portion which is connected to the cabinet and does not allow the server to be moved by being locked to the locked portion, and the locking portion is locked to the locked portion in coordination with the locking operation by the first locking mechanism.

4. The cabinet with a lock according to claim 1, wherein the plurality of casters movably support the cabinet, and the second locking mechanism locks at least any of the plurality of casters.

5. The cabinet with a lock according to claim 4, wherein the second locking mechanism includes an engaged portion provided in the caster and an engagement portion which does not allow the caster to rotate by being engaged with the engaged portion, and the engagement portion is engaged with the engaged portion in coordination with the locking operation by the first locking mechanism.

6. The cabinet with a lock according to claim 1, wherein the cabinet is provided with a lock manipulation portion for activating the first locking mechanism.

7. The cabinet with a lock according to claim 1, wherein a plurality of the first locking mechanisms are provided.

8. The cabinet with a lock according to claim 7, wherein the door portion is a first door portion and the cabinet includes a second door portion which is opened and closed for taking in and out the server,
   the first door portion and the second door portion are provided in respective side surfaces of the cabinet which are opposed to each other,
   a plurality of the first locking mechanisms include two first locking mechanisms,
   one of the two first locking mechanisms locks the first door portion, and
   the other of the two first locking mechanisms locks the second door portion.

9. The cabinet with a lock according to claim 1, wherein a plurality of the second locking mechanisms are provided.

10. The cabinet with a lock according to claim 9, wherein the cabinet includes sidewall portions which are connected to respective opposing ends of the door portion and extend in a direction opposite to a direction in which the door portion opens,
    the sidewall portions have one ends located on a side of the door portion and the other ends opposite to the one ends,
    the plurality of casters include a first caster located on the side of the door portion and a second caster located on a side of the other ends of the sidewall portions,
    the second locking mechanism includes two second locking mechanisms,
    one of the two second locking mechanisms locks the first caster, and
    the other of the two second locking mechanisms locks the second caster.

11. The cabinet with a lock according to claim 1, wherein the second locking mechanism locks the cabinet to an object arranged adjacently to the cabinet.

12. Information processing equipment comprising:
    the cabinet with a lock according to claim 1; and
    an image forming apparatus.

13. The information processing equipment according to claim 12, wherein
    the image forming apparatus is arranged on the cabinet with a lock, and
    the second locking mechanism locks the cabinet to the image forming apparatus.

* * * * *